(12) United States Patent
Hänsch et al.

(10) Patent No.: US 6,174,741 B1
(45) Date of Patent: Jan. 16, 2001

(54) METHOD FOR QUANTIFYING PROXIMITY EFFECT BY MEASURING DEVICE PERFORMANCE

(75) Inventors: Wilfried Hänsch, Midlothian; Frank Prein, Glen Allen, both of VA (US); Jürgen Faul, Radebeul (DE)

(73) Assignee: Siemens Aktiengesellschaft, Munich (DE)

( * ) Notice: Under 35 U.S.C. 154(b), the term of this patent shall be extended for 0 days.

(21) Appl. No.: 08/994,273

(22) Filed: Dec. 19, 1997

(51) Int. Cl.[7] .............................. G01R 31/26; H01L 21/66
(52) U.S. Cl. ..................... 438/14; 438/11; 438/16; 438/18; 430/5; 430/30; 430/312
(58) Field of Search ................. 438/11, 14, 16, 438/18; 430/5, 30, 312

(56) References Cited

U.S. PATENT DOCUMENTS

| | | |
|---|---|---|
| 4,967,088 | 10/1990 | Stengl et al. ................ 250/491.1 |
| 5,208,124 | 5/1993 | Sporon-Fiedler et al. ............ 430/5 |
| 5,340,700 | 8/1994 | Chen et al. ..................... 430/312 |
| 5,426,375 * | 6/1995 | Roy et al. ...................... 438/11 |

* cited by examiner

Primary Examiner—Charles Bowers
Assistant Examiner—Hsien Ming Lee
(74) Attorney, Agent, or Firm—Stanton Braden

(57) ABSTRACT

Improved techniques for quantifying proximity effects during fabrication of integrated circuits are disclosed. The improved techniques use active features formed on a semiconductor wafer to quantify proximity effects. According to the improved techniques, a device performance quantity for an active feature is measured, and then a feature length for the active feature is determined in accordance with the measured device performance quantity. The fabrication processing can then be evaluated and/or compensated based on the determined feature length. In one example, the active feature can be a metal-oxide semiconductor (MOS) transistor and the device performance quantity can be current.

13 Claims, 6 Drawing Sheets

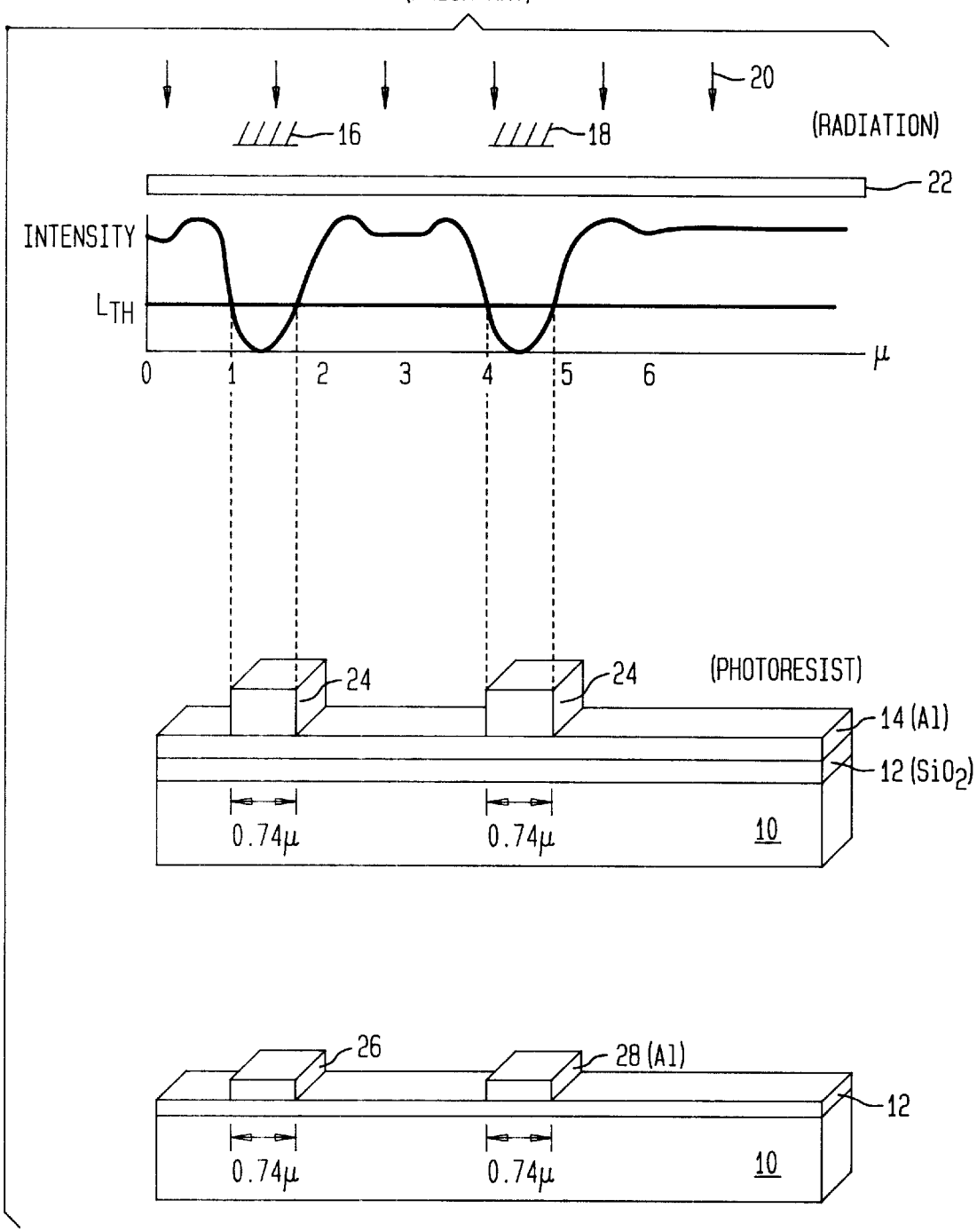

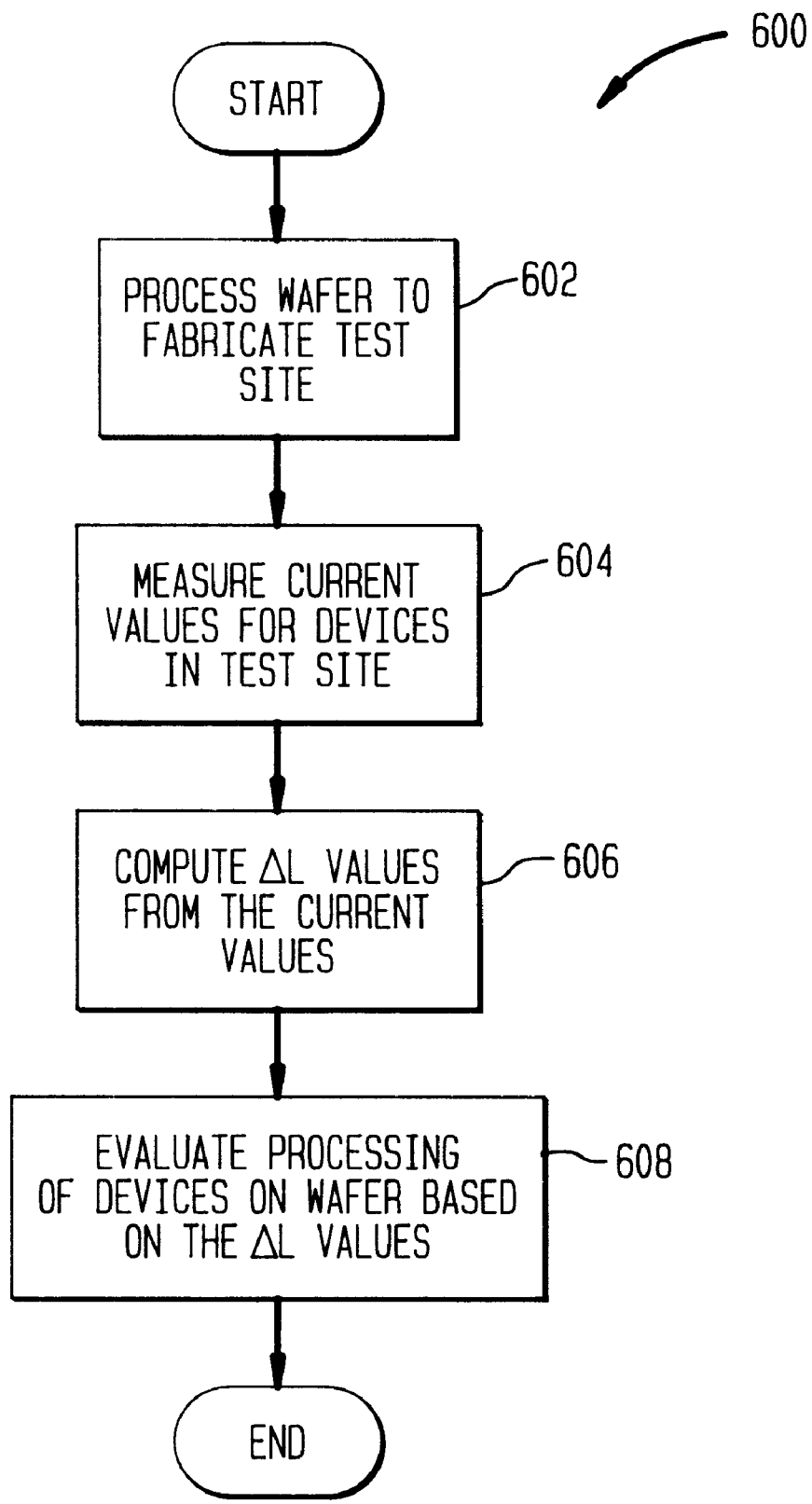

METHOD FOR QUANTIFYING PROXIMITY EFFECT BY MEASURING DEVICE PERFORMANCE

BACKGROUND OF THE INVENTION

1. Field of the Invention

The present invention relates to semiconductor fabrication and, more particularly, to compensation for proximity effects that result during fabricating integrated circuits.

2. Description of the Related Art

Photolithography is an important part of fabricating integrated circuits. In photolithography, a light opaque pattern imprinted on a mask or reticle interposed between a radiation source and a photosensitive resist (photoresist) layer on a semiconductor wafer. If the photoresist polarity is positive, the exposed portions of the photoresist with respect to the radiation source are easily dissolved or otherwise removed in a subsequent development step. The unexposed portions of the positive photoresist remain polymerized and will not be removed during the development step. After the exposed portions of the photoresist are dissolved and removed, the resulting wafer uses the remaining patterned photoresist layer as a protective layer to, for example, block the deposition of dopants or to prevent etching of one or more layers underlying the remaining photoresist.

One type of projection photolithographic process uses a mask (containing the entire wafer pattern) which is spaced close to the wafer. In this process, no lens system is required to focus the mask image onto the wafer surface. Another type of projection photolithographic process uses a mask spaced away from the wafer, wherein a lens system interposed between the mask and wafer is used to focus the pattern of the mask onto the entire wafer.

An improved type of projection photolithographic process uses a reticle, which contains a pattern for a single die or a relatively small portion of the wafer. This process uses a stepper, wherein the reticle is mounted typically 50 centimeters to 1 meter from the wafer, and a lens system focuses the reticle pattern on a small portion of the wafer to expose the photoresist. The wafer is then slightly shifted relative to the reticle image, and the exposure process is repeated until substantially the entire wafer has been exposed by the same reticle in a repeated pattern.

As is well known, a major limiting factor in image resolution when using any photolithographic process is the diffraction of light, where light bends around the mask or reticle pattern. Due to diffraction, the mask or reticle pattern is slightly distorted when the pattern image is projected onto the wafer surface. This distortion is often referred to as the proximity effect.

With conventional projection photolithographic methods using conventional masks and reticles, line widths of lines within a dense pattern of lines formed on a wafer surface are narrower than line widths of isolated lines, even though all line widths on the mask or reticle are identical. Such is the case where a positive photoresist is used and the opaque portions of the mask or reticle correspond to the lines and other features to be formed on the wafer surface. Where a negative photoresist is used, causing the clear portions of the mask or reticle to correspond to the lines and other features formed on the wafer surface, the effect would be the opposite.

Thus, the resulting wafer contains feature sizes that are dependent upon whether a feature is isolated or within a dense pattern. This results in unpredictable feature sizes.

One skilled in the art of integrated circuit design will be aware of the various problems which may result from unpredictable feature sizes, such as differing electrical characteristics. In any case, the change in feature size due to the impact of other nearby features is known as the proximity effect. Although the following discussion assumes the features are lines, the features can have any geometric shape and are not limited to lines.

FIGS. 1A and 1B are diagrams that illustrate the proximity effect with respect to a simple metalization process. In FIG. 1A, a wafer 10 has an unpatterned layer of silicon dioxide 12 formed on its surface. A metal layer 14, typically aluminum, is then deposited on the surface of wafer 10 over the silicon dioxide 12 using conventional techniques. A layer of positive photoresist is then spun onto the surface of the wafer 10 to completely coat the surface of the wafer. Using well-known techniques, the wafer surface is then selectively exposed to radiation through a reticle in accordance with a reticle pattern. The reticle pattern is represented by light blocking portions 16 and 18, which block light (radiation) from a lamp that is used to expose the photoresist. Downward arrows represent partially coherent radiation 20 from the lamp. A lens 22 focuses the image of the reticle onto the surface of wafer 10. The x-axis of the graph in FIG. 1A represents the distance along the wafer 10 surface, and the y-axis of the graph represents the resulting light intensity on the wafer 10 surface.

As seen by the intensity of light impinging upon the wafer surface, a certain low level of light intensity exists under light blocking portions 16 and 18 due to the diffraction of light, whereby the light waves traveling in straight paths bend around light blocking portions 16 and 18. Thus, additional area of the photoresist is exposed to light due to the diffraction of light. As a result of the diffraction, the light waves from radiation 20 have constructively and destructively interfered with one another as a result of the diffraction of light. Hence, where the light intensity is increased due to constructive interference, the photoresist will be even more exposed. The extent of diffraction is a function of light coherency, numerical aperture of the lens used, and other factors, as known in the art.

It is assumed for purposes of illustration that any photoresist exposed to light above a threshold intensity level $L_{TH}$ will be dissolved away during development of the photoresist. This threshold light intensity level $L_{TH}$ is represented on the y-axis of the graph in FIG. 1A.

After the wafer 10 is sufficiently exposed to the light pattern and after the exposed photoresist has been removed, the photoresist portions 24 remain. In this example, the width of photoresist portions 24 is 0.74 microns. Next, the exposed metal layer 14 is anisotropically etched, using well-known techniques, and photoresist portions 24 are thereafter removed with a photoresist stripper. The remaining oxide 12 may then be removed as desired. What remains is a metal pattern including parallel metal lines 26 and 28, whose geometrics are dictated by the geometries of light blocking portions 16 and 18 and by the spaces between the light blocking portions. The width of light blocking portions 16 and 18 corresponds to metal line widths of 0.74 microns. In this example, the pitch or distance between the centers of metal lines 26 and 28 is three microns. Hence, in this example, the pitch of three microns for parallel metal lines 26 and 28 is large enough so that the diffraction from light blocking portion 16 does not influence the shape of metal line 28 and the diffraction from light blocking 18 does not influence the shape of metal line 26.

FIG. 1B illustrates a similar example where metal lines 30, 31 and 32 being patterned have a smaller pitch (i.e., greater density) than did the metal lines 26 and 28 of FIG. 1A. Here, the pitch between metal lines 30, 31 and 32 is 1.5 microns. As illustrated, the resulting lengths of metal lines 30, 31 and 32 are less than 0.74 microns, even though the widths of light blocking portions 40–42 of the reticle are identical to the widths of light blocking portions 16 and 18 in FIG. 1A. This is because light blocking portions 40–42 are situated sufficiently close to one another such that the diffraction from light blocking portions 40 and 42 cause a greater amount of photoresist under the center light blocking portion 41 to be exposed above the threshold intensity $L_{TH}$. Also, the diffraction effects from light blocking portion 41 cause a greater amount of photoresist under light blocking portions 40 and 42 to be exposed above the threshold intensity $L_{TH}$. Consequently, the metal line 31 is narrower than metal lines 30 and 32, since the length of the metal line 31 is reduced on both sides by the diffraction due to the light blocking portions 40 and 42.

The undesirable consequences of the proximity effect discussed above with reference to FIGS. 1A and 1B are for a representative example. However, it should be understood that the proximity effect is inherent in photolithographic processing regardless of feature geometries or materials.

Additionally, etching features on a semiconductor wafer also leads to undesirable proximity effects. Here, the proximity effect is due not to diffraction of light, but instead due residue polymer or transport of removed material from the surface of the semiconductor surface, for example. In any case, the proximity effect causes the etching process to yield different etch rates depending on whether a feature being etched is isolated from or within a dense pattern of other features. For example, when the features are formed in a dense pattern, the resulting etch rate is higher, whereas when the features are somewhat isolated from one another, the resulting etch rate is lower.

Accordingly, when lithographic and etch processing are utilized in fabricating integrated circuits, the impact of the proximity effect should be monitored and corrected. The monitoring of the proximity effect is conventionally by measuring the lengths of the resulting features that are formed by the lithographic and etch processing. Conventionally, the lengths of the resulting features from the lithography and etch processing are measured by a resistance approach or an electron microscope. The electron microscope can be used to accurately measure lengths but is expensive, time consuming and destructive to the integrated circuit, and thus is often not a practical solution. With the resistance approach, the sheet resistance of the formed features is measured. The sheet resistances are then used to compute the lengths of the formed features. Thereafter, these measured lengths are compared to the intended lengths for the features, and when the deviation is beyond a tolerance level, Optical Proximity Correction (OPC) is performed to alter the mask or reticle to compensate for the proximity effect.

One problem with the conventional resistive approach for measuring the lengths of the features is that in many cases the resistance measured does not accurately correspond to the length of the feature being measured. When this occurs, the lengths that are computed from the measured resistances have a loss of accuracy. As a result, the proximity effect is not able to be accurately quantified.

Thus, there is a need for improved techniques for measuring lengths of features formed on a wafer so that proximity effects can be accurately quantified.

SUMMARY OF THE INVENTION

Broadly speaking, the invention relates to improved techniques for quantifying proximity effects during fabrication of integrated circuits. The invention uses active features formed on a semiconductor wafer to quantify proximity effects. According to the invention, a device performance quantity for an active feature is measured, and then a feature length for the active feature is determined in accordance with the measured device performance quantity. The fabrication processing can then be evaluated and/or compensated based on the determined feature length. In one example, the active feature can be a metal-oxide semiconductor (MOS) transistor and the device performance quantity can be current.

The invention can be implemented in numerous ways, including as a method and a device. Several embodiments of the invention are discussed below.

As a method for measuring proximity effects of processing that forms devices on a semiconductor wafer, an embodiment of the invention includes the operations of: fabricating test devices on the wafer, the test devices including MOS transistors; measuring current values for the MOS transistors of the test devices; and determining proximity effects induced during the fabricating of the test devices based on the measured current values for the MOS transistor of the test devices.

As a method for monitoring performance of devices formed on a semiconductor wafer, another embodiment of the invention includes the operations of: fabricating test devices on the wafer; measuring current values for the test devices; determining proximity effects induced during the fabricating based on the measured current values for the test devices; and evaluating processing that forms devices on the wafer using the determined proximity effects.

As a semiconductor wafer having a test site formed thereon for monitoring proximity effects induced during fabrication of devices on the wafer, the test device according to an embodiment of the invention includes: a plurality of MOS transistors, each of the MOS transistors includes a source, a drain and a gate line, the gate line has a substantially rectangular shape with a width (W) and a length (L); a plurality of first adjacent dummy gate lines, each of the first adjacent dummy gate lines having a substantially rectangular shape, and each of the first adjacent dummy gate lines being located adjacent to the drain of one of the MOS transistors and offset from the associated gate line by an offset distance; and a plurality of second adjacent dummy gate lines, each of the second adjacent dummy gate lines having a substantially rectangular shape, and each of the second adjacent dummy gate lines being located adjacent to the source of one of the MOS transistors and offset from the associated gate line by the offset distance.

The advantages of the invention are numerous. One advantage of the invention is that the proximity effects are able to be monitored with increased accuracy. Another advantage of the invention is that active test structures are used for monitoring proximity effects so that a device relevant quantity (e.g., current) can be used to not only quantify the proximity effect but also the measure device performance.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 1A and 1B are diagrams that illustrate a proximity effect with respect to a simple metalization process;

FIG. 6 is a flow diagram of a process for evaluating the device performance of devices formed on a semiconductor wafer.

DETAILED DESCRIPTION OF THE INVENTION

The invention relates to improved techniques for quantifying proximity effects during fabrication of integrated circuits. The invention uses active features formed on a semiconductor wafer to quantify proximity effects. According to the invention, a device performance quantity for an active feature is measured, and then a feature length for the active feature is determined in accordance with the measured device performance quantity. The fabrication processing can then be evaluated and/or compensated based on the determined feature length. In one example, the active feature can be a metal-oxide semiconductor (MOS) transistor and the device performance quantity can be current.

Embodiments of the invention are discussed below with reference to FIGS. 2–6. However, those skilled in the art will readily appreciate that the detailed description given herein with respect to these figures is for explanatory purposes as the invention extends beyond these limited embodiments.

In fabricating integrated circuits with metal-oxide semiconductor (MOS) transistors very densely packed (e.g., dynamic random access memory), the accuracy of the fabrication is very important and becomes more important as feature sizes get smaller. As a result of the higher densities, proximity effects becomes more pronounced during the lithographic and etch processing portions of the fabrication. Hence, there is an ever increasing need to measure and compensated for the undesired proximity effects.

Conventionally, as noted above, a feature size is often measured by a sheet resistance. The sheet resistance is then used to determine the length of the feature. If the length of the feature is determined to be too small or too large, then a mask or reticle used in fabricating the feature can be altered so that the resulting length of the feature is as desired despite proximity effects. However, as noted above, there are disadvantages with this approach. First, the resistance measured is not a device relevant quantity for most circuit designs. Second, when the features are gate lines of MOS transistors formed by a stacked structure of different materials, the resistance is primarily governed by the lowest resistance layer. However, the lowest resistance layer is not a very accurate predictor of the gate length because the gate structures have tapered sides and the lowest resistance layer tends to be the smallest layer.

Figure 1B:
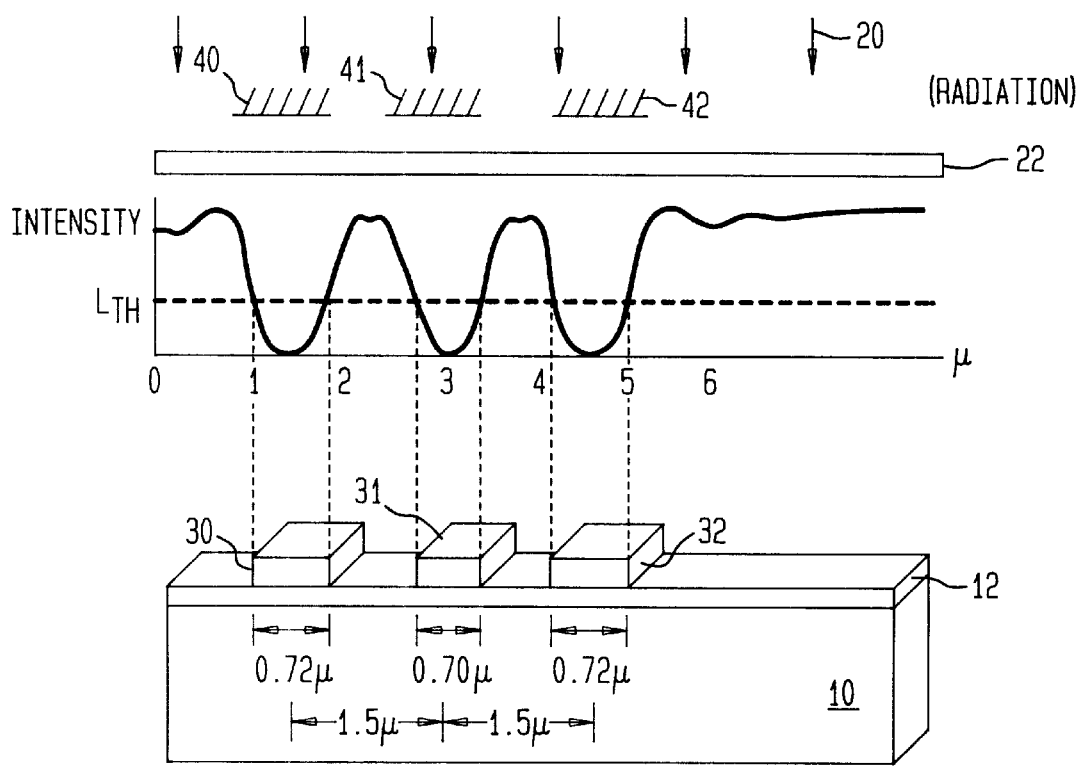
Figure 2:
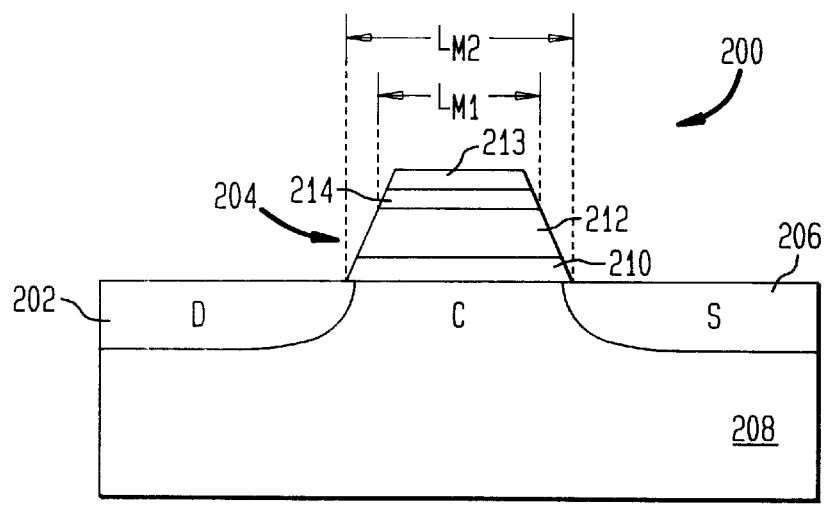
FIG. 2 is a cross sectional diagram of a metal-oxide semiconductor (MOS) transistor having a drain, a gate and a source formed on a substrate.

FIG. 2 is a cross sectional diagram of a metal-oxide semiconductor (MOS) transistor 200 having a drain 202, a gate 204, and a source 206 formed on a substrate 208. As is well known, a channel (C) is formed between the drain 202 and the source 206 and controlled by the potential provided on the gate 204. The fabrication of the gate of the transistor 200 is done by etching process that normally leaves the sides of the gate 204 tapered. More particularly, the gate 204 is normally thinner at the top portion than it is at the bottom portion closer to the channel (C). In addition, the gate 204 is usually a stacked structure consisting of a gate oxide 210 (e.g., $SiO_2$), a polysilicon layer 212, and a tungsten (W) (or titanium (Ti)) layer. The stacked structure for the gate 204 illustrated in FIG. 2 also typically includes an isolation cap 213 which is often formed of oxide or nitride.

Conventionally, the resistance of the gate 204 could be measured to determine the length of the gate 204. However, in the case of a gate stack structure, the measured resistance of the gate stack is determined by the lowest resistivity of the layers of the gate stack. In this example, the lowest resistivity material would be the tungsten layer 214 which is the top layer of the gate stack structure. Hence, the resistance approach would in effect measure the length of the tungsten layer 214 which has a length ($L_{M1}$) as shown in FIG. 2.

However, as illustrated in FIG. 2, the length of the gate 204 is better measured as the length of the widest layer of the gate stack structure, namely, the gate oxide layer 210. It is the bottom of the polysilicon layer 212 that defines the length of the channel (C) because the ion implantation that forms the drain 202 and the source 206 occurs after the gate stack structure is formed and defines the regions for the drain 202 and the source 206.

According to the invention, improved techniques are useful for measuring both feature length (e.g., gate length), channel (C) length and proximity effects. With respect to FIG. 2, the length of the gate measured is the length ($L_{M2}$) which is more accurate measurement of the gate length (and likewise the channel (C) length and the proximity effects) than is the length ($L_{M1}$) that would be conventionally measured using the resistance approach.

The improved techniques for quantifying both proximity effects and channel length are discussed in detail below. According to the invention, a series of test devices are fabricated on a semiconductor wafer, feature length measurements are determined, and then the fabrication processing is altered (or optimized) as needed to further compensate for proximity effects.

Figure 3A:
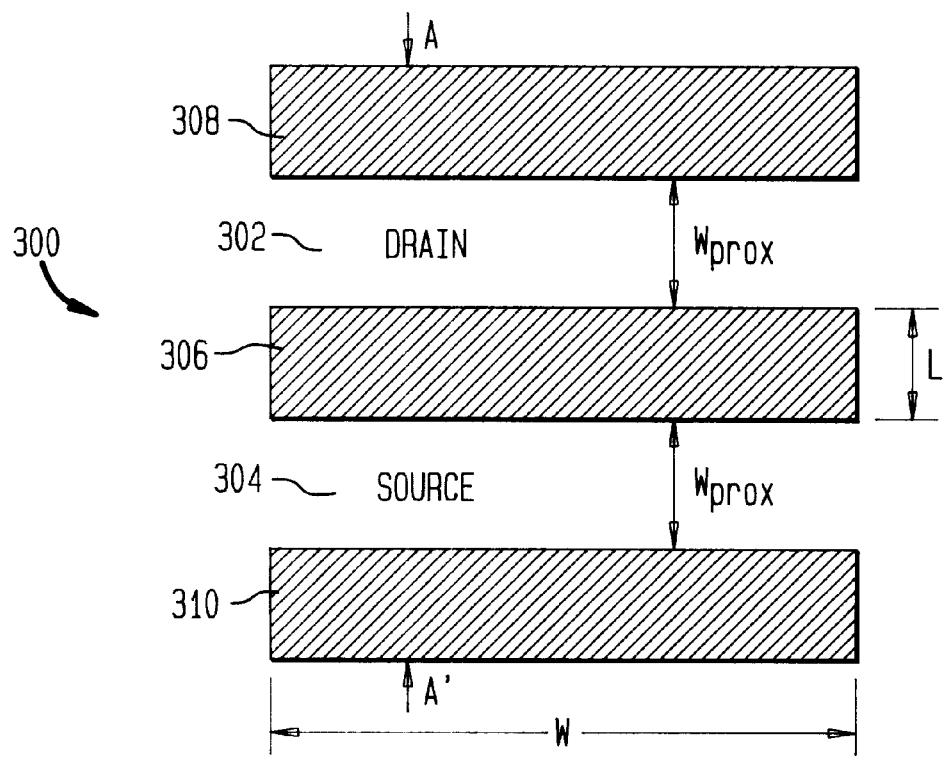
FIG. 3A is a diagram of a test device according to an embodiment of the invention.

FIG. 3A is a diagram of a test device 300 according to an embodiment of the invention. The test device 300 is an active MOS transistor having a drain 302, a source 304 and a gate line 306. The gate line 306 has a width (W) and a length (L). The test device 300 also includes a first dummy gate line 308 and a second dummy gate line 310. The first dummy gate line 308 is positioned in parallel with the gate line 306 but offset therefrom by an offset distance ($W_{PROX}$). The second dummy gate line 310 is provided in parallel with gate line 306 and offset therefrom by the offset distance ($W_{PROX}$). Hence, the test device 300 includes a MOS transistor together with nearby features (i.e., the first and second dummy gate lines 308 and 310) that cause a proximity effect that alters the length (L) of the gate line 306 during fabrication of the test device 300 on a wafer. As known in the art, the proximity effect is due to diffraction of light while performing lithographic processing as well as due to etch processing, both of which occur during the fabrication of the test device 300. Hence, the test device 300 provides an indication of the extent to which the proximity effect will alter the length (L) of the late line 306 from its design length for a given length (L) and a given offset distance ($W_{PROX}$). The offset distance ($W_{PROX}$) is a proximity distance for the proximity effect.

Figure 3B:
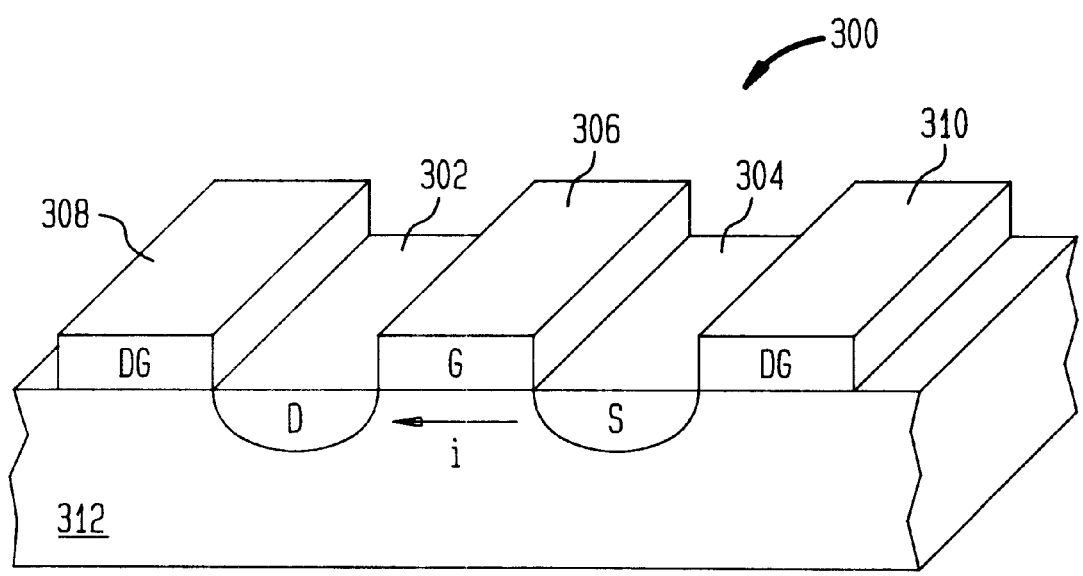
FIG. 3B is a cross-sectional perspective view of the test device illustrated in FIG. 3A.

FIG. 3B is a cross-sectional perspective view of the test device 300. The cross-section illustrated in FIG. 3B is with respect to reference line A–A' indicated in FIG. 3A. The test device 300 is formed on a substrate 312 as is well known in the art. The MOS transistor within the test device 300 is formed by the drain 302, the source 304 and the gate 306 and operates to produce a current (i) from the source 304 to the drain 302 when the gate 306 is properly biased. Hence, the test device 300 is an active device.

The active nature of the test device 300 (namely, the MOS transistor) is used to evaluate not only proximity effects but also device performance. As for proximity effects, the test device provides a reference as to the amount of proximity effect that gate lines of actual devices fabricated on the wafer will undergo. When a series of test devices are provided with different characteristics, a number of different references can be obtained so that a wide range of proximity effect information is available. As for device performance, the current (i) is a design relevant quantity as many integrated circuit designs have current levels that are intended. Hence, by the test devices being able to provide currents (i), the fabrication processing is able to closely conform to integrated circuit designs despite various processing variances and proximity effects.

Figure 4:
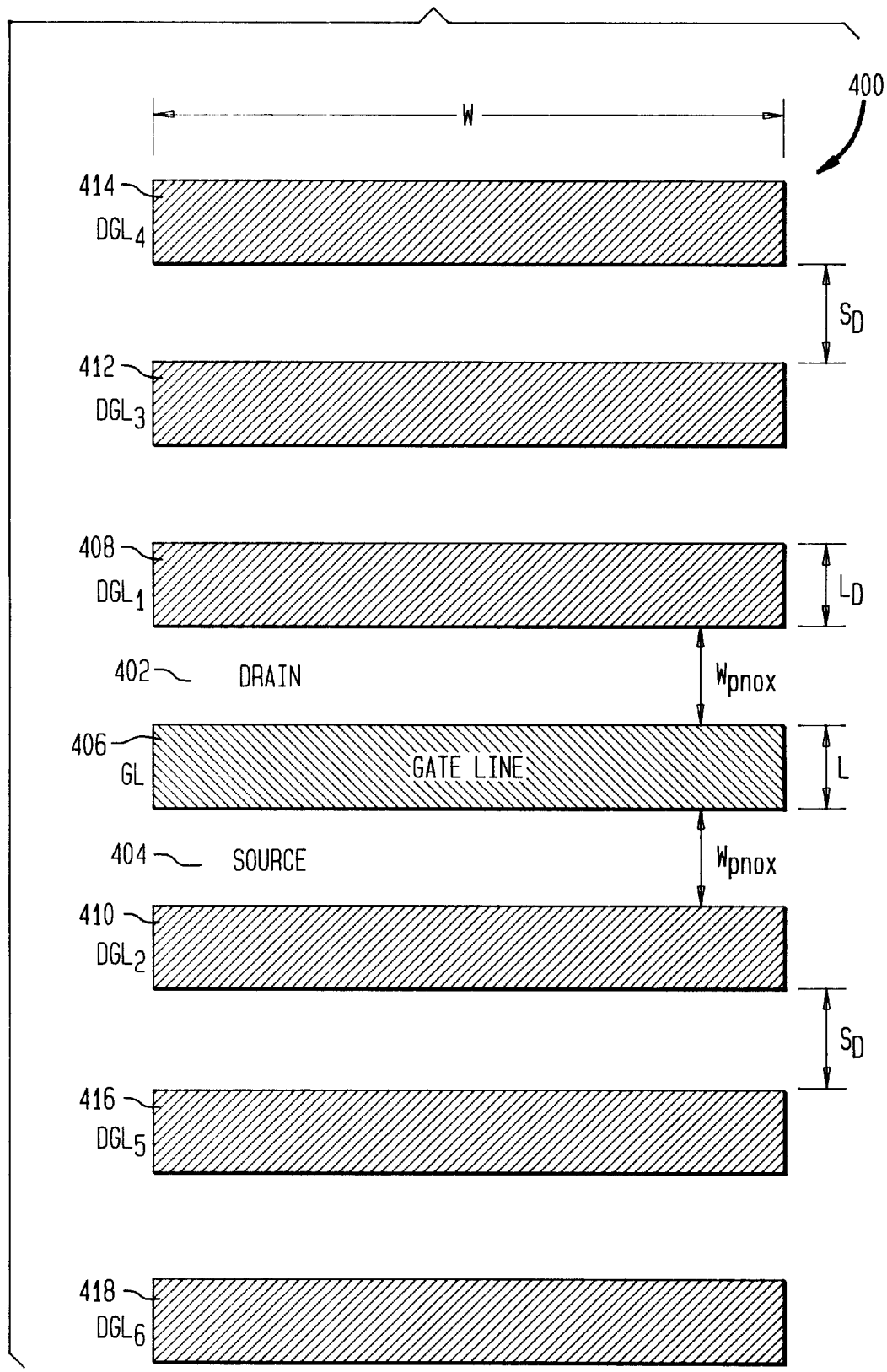
FIG. 4 is a diagram of a test device according to another embodiment of the invention.

FIG. 4 is a diagram of a test device 400 according to another embodiment of the invention. The test device 400 is similar to the test device 300 illustrated in FIG. 3A, with the exception that additional dummy gates are provided with the test structure 400.

The test device 400 includes a drain 402, a source 404 and a gate line (GL) 406. The gate line (GL) 406 is a substantially rectangular feature with a width (W) and a length (L). The gate line (GL) 406 is preferably a stacked gate structure with a gate oxide layer, a polysilicon layer and a tungsten layer such as illustrated in FIG. 2. The test device 400 also includes a first dummy gate line ($DGL_1$) 408 and a second dummy gate line ($DGL_2$) 410. The first dummy gate line ($DGL_1$) 408 is a substantially rectangular feature having a width (W) and a length ($L_D$). The first dummy gate line ($DGL_1$) 408 is parallel to the gate line (GL) 406 on the drain 402 side of the gate line (GL) 406, but is offset from the gate line (GL) 406 by a distance ($W_{PROX}$). Similarly, the second dummy gate line ($DGL_2$) 410 is a substantially rectangular feature having the width (W) and the length ($L_D$). The second dummy gate line ($DGL_2$) 410 is parallel to the gate line (GL) 406 on the source 404 side of the gate line (GL) 406, but is offset from the gate line (GL) 406 by the distance ($W_{PROX}$).

The test device 400 can further include additional dummy gate lines that do not impact the length (L) of the gate line (GL) 406 due to proximity effects but can be nevertheless provided for planarization where the fabrication processing does not permit substantial spaces on the wafer without having gate material thereon. When the additional dummy gate lines are provided, they are preferably provided in an essentially uniform manner. In particular, a dummy gate line ($DGL_3$) 412 is a substantially rectangular feature offset from the first dummy gate line ($DGL_1$) 408 by a separation distance (SD). A fourth dummy gate line ($DGL_4$) 414 is a substantially rectangular feature that is offset from the third dummy gate line ($DGL_3$) 412 by the separation distance (SD). In a similar manner, a fifth dummy gate line ($DGL_5$) 416 is a substantially rectangular feature that is offset from the second dummy gate line ($DGL_2$) 410 by the separation distance (SD). Also, a sixth dummy gate line ($DGL_6$) 418 is a substantially rectangular feature that is offset from the fifth dummy gate line ($DGL_5$) 416 by the separation distance (SD). The dummy gate lines can be formed from a variety of materials. One suitable material for the dummy gate lines is polysilicon. In one embodiment, the length (L) and width (W) of the all dummy gate lines are the same, and the offset distances (SD) between the dummy gate lines are all the same.

In order for the techniques according to the invention to cover a wide range of proximity effects, a test site on a semiconductor wafer includes a number of test devices such as illustrated in FIGS. 3 and 4. In one embodiment, each of the test devices have a different combination of the length (L) and the offset difference ($W_{PROX}$).

Figure 5:
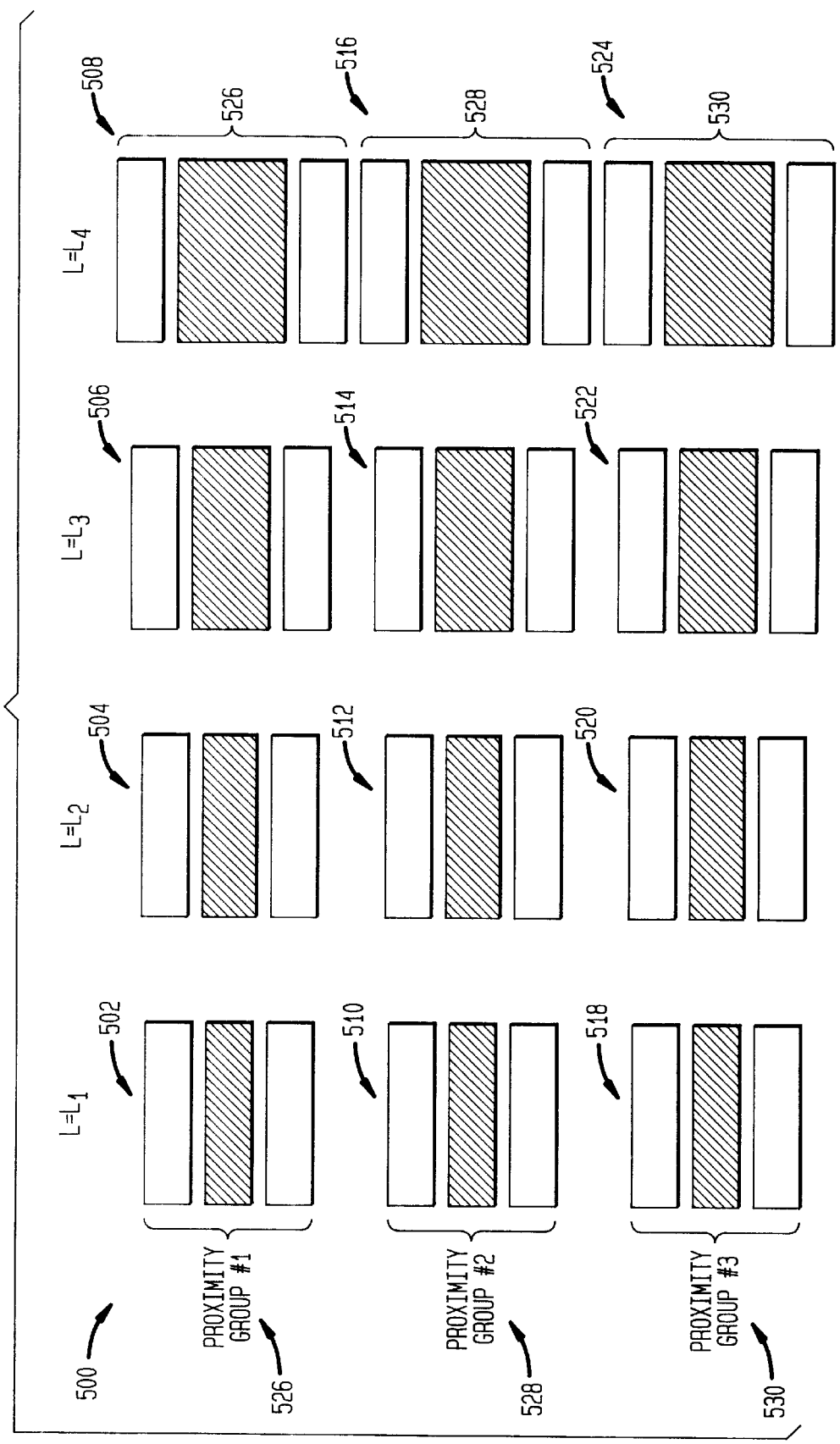
FIG. 5 is a diagram of a test site on a semiconductor wafer according to an embodiment of the invention.

FIG. 5 is a diagram of a test site 500 on a semiconductor wafer according to an embodiment of the invention. The test site 500 includes a plurality of test devices. Specifically, in the test site 500 there are twelve (12) test devices 502–524. The test devices 502–524 include at least a source, a drain, a gate line and a pair of dummy gate lines. For example, the test devices can be formed as illustrated in FIGS. 3 and 4.

Each of the test devices 502–524 is associated with a proximity group and a length value. In this embodiment, assume that the length values are $L_1$, $L_2$, $L_3$ and $L_4$, with the length $L_1$ being the shortest and the length $L_4$ being the longest. In this embodiment, there are also three proximity groups 526, 526 and 530.

In a first proximity group 526, the offset difference between the gate lines and the dummy gate lines is a first offset distance (e.g., $W_{PROX}$). In other words, the gate lines are separated from the dummy gate lines in each of the test devices 502–508 within the first proximity group 526 by the first offset distance. However, the changing of the length (L) of the gate lines of the test devices 502–508 in the first proximity group 526 causes the length of the gate lines to increase from left to right. In particular, the gate lines of the test devices 502–508 have the lengths $L_1$, $L_2$, $L_3$ and $L_4$, respectively.

In a second proximity group 528, the offset difference between the gate lines and dummy gate lines is a second offset distance (e.g., $W_{PROX}$). The second offset distance is increased as compared to the first offset difference utilized by the first proximity group 526. The second proximity group 528 includes test devices 510–516. The length (L) of the gate lines of the test devices 510–516 in the second proximity group 528 increases from left to right in accordance with the lengths $L_1$, $L_2$, $L_3$ and $L_4$, respectively.

In a third proximity group 530, the offset difference between the gate lines and dummy gate lines is a third offset distance (e.g., $W_{PROX}$). The third offset distance is increased as compared to the second offset difference utilized by the second proximity group 528. The third proximity group 530 includes test devices 518–524. The length (L) of the gate lines of the test devices 518–524 in the third proximity group 530 increases from left to right in accordance with the lengths $L_1$, $L_2$, $L_3$ and $L_4$, respectively.

The number of proximity groups and the number of different lengths (L) for the gates of the test devices can widely vary. In one particular embodiment, there are six proximity groups and four lengths (L) used in each of the proximity groups. The embodiment therefore includes twenty-four (24) test devices. Examples of the four lengths (L) are 0.45, 0.6, 0.75 and 1.15 microns, with a width (W) in each case 20 microns. Examples of the offset distances used by the six proximity groups are 0.35, 0.55, 0.8, 1.05, 1.30 and 1.80 microns.

By fabricating a plurality of the test devices with different gate length (L) and offset difference ($W_{PROX}$) combinations, allows a proximity curve for the fabrication processing to be formed. The proximity curve then is used to ensure that the masks or reticles are all properly compensated for the proximity effects using well known Optical Proximity Corrections (OPC). This allows the fabrication processing that is used to form functional (non-test) features (e.g., MOS transistors) of an integrated circuit design to be carefully evaluated and suitably adjusted over the wide range of densities and gate lengths.

According to the invention, the channel length (e.g., $L_{M2}$ in FIG. 2) is able to be accurately determined using a device current through the channel (C) in at least one test device formed on a wafer. Then, a current measurement for the test device is obtained. The current measurements obtained from the test device in turn provides an indication of ΔL, where ΔL refers to the difference between a designed length for the feature (e.g., gate) of the test device and the effective length of the feature of the device as fabricated. The effective length of the device is defined, to a first approximation, as the distance of the metallurgical P-N junction caused by diffusion (i.e., the channel (C) length).

FIG. 6 is a flow diagram of a evaluation processing 600 for evaluating the device performance of devices formed on a semiconductor wafer. The evaluation processing 600 initially processes a wafer to fabricate a test site including a plurality of test devices. The wafer may also be processed such that active, non-test, devices are also fabricated on the wafer. Here, the fabrication processing includes a number of steps including lithography and etching so as to pattern the polysilicon layers or other layers on the wafer.

After having fabricated the test site, current values are measured 604 for the test devices in the test site. As previously noted, by measuring the current values, an accurate estimate of the channel length is obtained for the test devices. The device current of the test devices is directly impacted by the length of the gate over the P-N junction of the MOS transistor of the test device. Hence, ΔL values are then computed 606 from the current values. Since the current values are more accurate of the length of the P-N channel, then with the conventional resistive techniques, the ΔL values that are computed are more accuracy than those conventionally obtained. Various techniques for determining L and ΔL values are known in the art, and several of which are described in De La Moneda et al., "Measurement of MOSFET Constants," IEEE Electron Device Letters, Vol. EDL-3, No. 1, January 1982, which is hereby incorporated by reference.

Next, the evaluation processing 600 operates to evaluate 606 the devices on the wafer based on the ΔL values. Here, for example, the processing of the devices are evaluated 606 to indicate whether the ΔL values are within reasonable limits. If the ΔL values are within reasonable limits, then the processing is sufficiently optimized. On the other hand, when the ΔL values indicate that the processing is not well optimized, then the processing is calibrated or optimized to provide further Optical Proximity Correction (OPC) for the mask such that the ΔL values can be improved.

Typically, the techniques utilized by the invention are implemented during the design and development stages for a particular semiconductor chip design. The test site includes the test devices described above during the design and development phase so that the processing may be optimized to compensate properly for diffraction during lithographic processes and for different etch rates during etching processes. Once the process has been optimized, and full production is utilized, then a conventional resistive measurement technique could be utilized (after having correlated the current values to resistive values), while not having to make as many measurements as required by the invention.

The advantages of the invention are numerous. One advantage of the invention is that the proximity effects are able to be monitored with increased accuracy. Another advantage of the invention is that active test structures are used for monitoring proximity effects so that a device relevant quantity (e.g., current) can be used to not only quantify the proximity effect but also measure device performance.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for measuring proximity effects of processing that forms devices on a semiconductor wafer, said method comprising:

fabricating test site devices on the wafer, said test site devices including MOS transistors;

measuring current values for the MOS transistors of said test site devices; and determining proximity effects induced during said fabricating of said test site devices based on the measured current values for the MOS transistor of said test site devices.

2. The method of claim 1, wherein the MOS transistors of said test site devices include a drain, a source and a gate, and the current values measured represent current flowing between the source and the drain.

3. The method of claim 1, wherein the MOS transistors of said test site devices include a drain, a source and a gate, and wherein said test site devices further include proximity model features adjacent to both sides of the gate but separated therefrom by a predetermined distance.

4. The method of claim 3, wherein the proximity effects are induced on the gates of the MOS transistors by the proximity model features and the degree of the proximity effect on the gate for the MOS transistor of a particular one of said test site devices is dependent on the predetermined distance from the gate to the adjacent one of the proximity model features.

5. The method of claim 1, wherein said determining of the proximity effects induced during said fabricating of said test site devices comprises:

converting the measured current values to effective length measurements;

determining length difference values between the effective length measurements and predetermined intended lengths; and determining the proximity effects induced based on the length difference values.

6. The method of claim 5, wherein the MOS transistors of said test site devices include a drain, a source and a gate, wherein said test site devices further include proximity model features adjacent to both sides of the gate but separated therefrom by a predetermined distance, wherein the proximity effects are induced on the gates of the MOS transistors by the proximity model features, wherein the effective length measurements represent the lengths of the gates of the MOS transistors, and wherein the degree of the proximity effect on the gate for the MOS transistor of a particular one of said test site devices is dependent on the predetermined distance.

7. The method of claim 5, wherein said fabricating includes lithographic processing in accordance with a mask, and wherein said method further comprises:

correcting said mask to reduce to proximity effects.

8. The method of claim 1, wherein said fabricating includes lithographic processing in accordance with a mask, and wherein said method further comprises:

correcting said mask to reduce to proximity effects.

9. A method for monitoring performance of devices formed on a semiconductor wafer, said method comprising:

fabricating test site devices on the wafer;

measuring current values for said test site devices;

determining proximity effects induced during said fabricating based on the measured current values for said test site devices; and evaluating processing that forms said test site devices on the wafer using the determined proximity effects.

10. The method of claim 9, wherein said test site devices are MOS transistors.

11. The method of claim 9, wherein said test site devices are MOS transistors, wherein said fabricating includes lithography processing and etch processing, and wherein said determining operates to determine the proximity effects caused during the lithography processing and/or etch processing of the gates of the MOS transistors.

12. The method of claim 9, wherein the MOS transistors include a drain, a source and a gate, and wherein the current values measured are for drive currents passing between the drain and source of the MOS transistors.

13. The method of claim 9, wherein said fabricating further fabricates actual test site devices on said wafer, and wherein said test site devices are formed in a test site region on said wafer, and said actual test site devices are formed in a remaining region on said wafer.

* * * * *